US010781009B2

(12) United States Patent
Barlow, Jr. et al.

(10) Patent No.: US 10,781,009 B2
(45) Date of Patent: Sep. 22, 2020

(54) SYSTEMS, APPARATUSES, AND METHODS FOR MARKING A MOVING FILM AND METHODS OF MANUFACTURE AND USE OF METALLIZED MARKED FILMS MADE THEREFROM

(71) Applicant: PRINTPACK ILLINOIS, INC., Elgin, IL (US)

(72) Inventors: William J. Barlow, Jr., Marietta, GA (US); Jeffrey Boekeloo, Acworth, GA (US); John Bumgardner, Bremen, GA (US); Timothy Taylor, Bowdon, GA (US)

(73) Assignee: PRINTPACK ILLINOIS, INC., Elgin, IL (US)

( * ) Notice: Subject to any disclaimer, the term of this patent is extended or adjusted under 35 U.S.C. 154(b) by 201 days.

(21) Appl. No.: 15/762,649

(22) PCT Filed: Aug. 24, 2016

(86) PCT No.: PCT/US2016/048310
§ 371 (c)(1),
(2) Date: Mar. 23, 2018

(87) PCT Pub. No.: WO2017/052913
PCT Pub. Date: Mar. 30, 2017

(65) Prior Publication Data
US 2018/0282010 A1 Oct. 4, 2018

Related U.S. Application Data

(60) Provisional application No. 62/232,514, filed on Sep. 25, 2015.

(51) Int. Cl.
*B41J 3/60* (2006.01)
*B65B 61/02* (2006.01)
(Continued)

(52) U.S. Cl.
CPC .......... *B65B 61/025* (2013.01); *B41F 13/025* (2013.01); *B41F 33/0081* (2013.01);
(Continued)

(58) Field of Classification Search
CPC ...... B41J 3/60; B41J 3/54; B41J 11/46; B65B 61/025; B41F 13/025; B41F 33/0081
See application file for complete search history.

(56) References Cited

U.S. PATENT DOCUMENTS 6,585,341 B1 * 7/2003 Walker ..................... B41J 2/125
250/559.44
2004/0179217 A1   9/2004 Chapman et al.
2016/0279978 A1 * 9/2016 Stephens ..................... B41J 3/60

FOREIGN PATENT DOCUMENTS

EP    0622237 A2   11/1994
EP    2100732 A1    9/2009
(Continued)

OTHER PUBLICATIONS

PCT International Search Report and Written Opinion for International Application No. PCT/US2016/048310 dated Nov. 3, 2016.

*Primary Examiner* — Chelsea E Stinson
(74) *Attorney, Agent, or Firm* — Eversheds Sutherland (US) LLP

(57) ABSTRACT

Systems for marking a moving film that include a triggering apparatus (140) that repeatedly provides a trigger signal, a controller (120) that receives the trigger signal and generates a marking signal, and a marking device (130) that receives the marking signal and marks the film are provided Also provided are methods for marking a moving film that employ the systems. Apparatuses for marking a moving film that include the triggering apparatus and the controller are also provided. Methods for making metallized marked films that include a film marked by these systems and a metallized layer, in which at least one marking is embedded within the
(Continued)

film are also provided. Also provided are methods for making packages and packing a product in these packages, in which the packages include the metallized marked films are also provided.

9 Claims, 7 Drawing Sheets

(51) Int. Cl.
| | |
|---|---|
| *B41J 3/407* | (2006.01) |
| *B41F 33/02* | (2006.01) |
| *B41F 33/00* | (2006.01) |
| *B41J 11/46* | (2006.01) |
| *B41F 13/02* | (2006.01) |
| *B41J 15/04* | (2006.01) |
| *B65H 23/188* | (2006.01) |
| *B41J 11/00* | (2006.01) |
| *B41J 29/38* | (2006.01) |
| *B65B 9/087* | (2012.01) |
| *B65B 51/26* | (2006.01) |
| *B65H 23/192* | (2006.01) |
| *B65H 37/00* | (2006.01) |
| *B65H 43/08* | (2006.01) |
| *C23C 14/02* | (2006.01) |
| *C23C 14/20* | (2006.01) |
| *B41J 2/44* | (2006.01) |

(52) U.S. Cl.
CPC ............... *B41F 33/02* (2013.01); *B41J 3/407* (2013.01); *B41J 11/0015* (2013.01); *B41J 11/0095* (2013.01); *B41J 11/46* (2013.01); *B41J 15/04* (2013.01); *B41J 29/38* (2013.01); *B65B 9/087* (2013.01); *B65B 51/26* (2013.01); *B65H 23/1882* (2013.01); *B65H 23/192* (2013.01); *B65H 37/00* (2013.01); *B65H 43/08* (2013.01); *C23C 14/02* (2013.01); *C23C 14/20* (2013.01); *B41J 2/44* (2013.01); *B65H 2403/92* (2013.01)

(56) References Cited

FOREIGN PATENT DOCUMENTS

| | | |
|---|---|---|
| WO | 2015/065446 A1 | 5/2015 |
| WO | 2015/143299 A1 | 9/2015 |

* cited by examiner

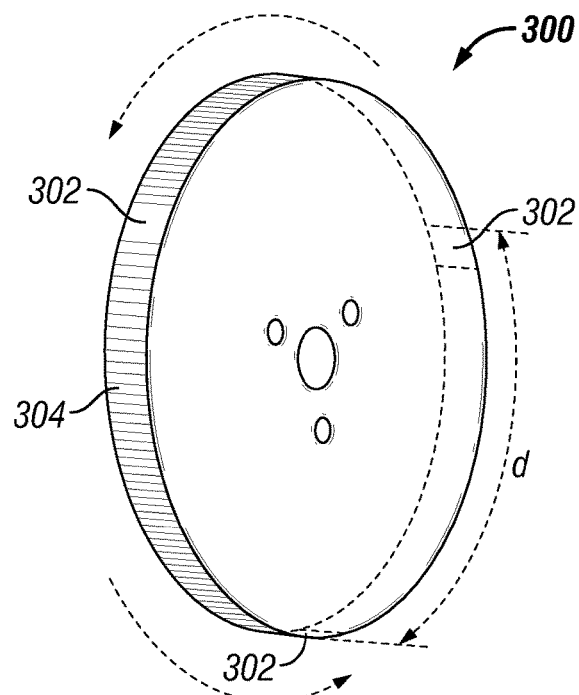
FIG. 3
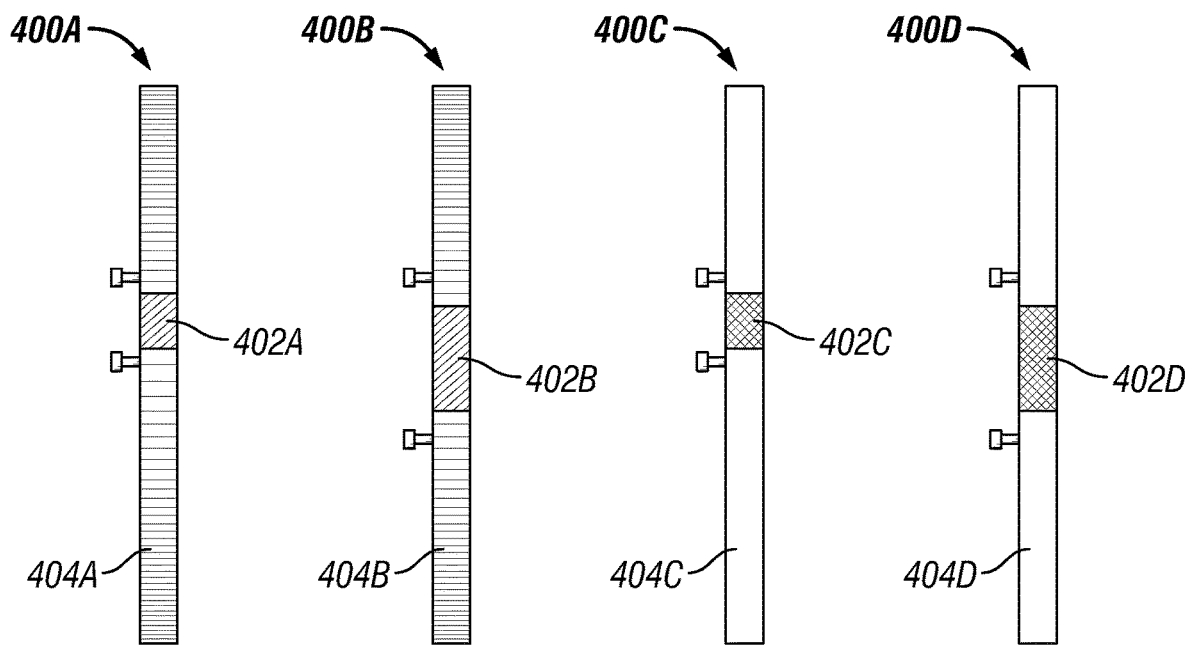
FIG. 4A  FIG. 4B  FIG. 4C  FIG. 4D

SYSTEMS, APPARATUSES, AND METHODS FOR MARKING A MOVING FILM AND METHODS OF MANUFACTURE AND USE OF METALLIZED MARKED FILMS MADE THEREFROM

CROSS-REFERENCE TO RELATED APPLICATIONS

This application claims priority to U.S. Provisional Patent Application No. 62/232,514, filed Sep. 25, 2015, which is incorporated herein by reference, and is a 35 U.S.C. § 371 national stage application of PCT Patent Application No. PCT/US2016/048310, filed Aug. 24, 2016, which is incorporated by reference in its entirety.

TECHNICAL FIELD

This present disclosure is generally in the field of packaging material, and more particularly to systems and apparatuses, which, for example, may be capable of marking a moving film, in register, without having pre-printed eyespots/reference marks thereon.

BACKGROUND

Webs of films are manufactured for many purposes, e.g., as packaging material wherein each web of film is printed with graphics and later formed into a package. Conventional approaches to printing graphics onto a moving film, in register, requires pre-application of eyespots/reference marks on the film at designated areas that are in register with the placement of desired graphic(s) subsequently printed onto the film. These traditional pre-applied eyespots/reference marks, during printing operations, are detected and trigger the printing of the graphic onto the film at the designated areas. However, the additional costs associated with the pre-application of eyespots/reference marks onto a film increase the overall manufacturing costs and time of the packaging process. Additionally, the pre-applied eyespots/reference marks are typically removed subsequent to the application of the desired graphics, e.g., for aesthetic purposes, thereby further adding to the increase in manufacturing cost and time of the resulting packages.

Furthermore, the effectiveness of traditional pre-applied eyespots/reference marks for controlling graphic application onto a moving film is limited with respect to positional accuracy and detection. However, the repeat distance of pre-applied eyespots/reference marks along the web of film may vary somewhat in the course of a production run, and therefore creating the inability for the marking equipment to correctly print/apply the desired graphics onto the predetermined locations of the film.

Accordingly, there exists a need to provide improved systems, apparatuses, and methods for marking a moving film without pre-applied eyespots/reference marks positioned thereon that are capable of ameliorating some or all of the foregoing disadvantages.

SUMMARY

In one aspect, systems for marking a moving film that moves at a predetermined line speed are provided. In one embodiment, the system includes a triggering apparatus that repeatedly provides a trigger signal based at least in part on the predetermined line speed, in which the trigger signal corresponds with one or more marking areas of the film to be marked thereon, a controller, in communication with the triggering device, that is configured to receive the trigger signal and, upon receipt of the trigger signal, generates a marking signal, and a marking device that receives the marking signal and, upon receipt of the marking signal, marks the film at substantially the one or more marking areas.

In another aspect, methods for marking a moving film are provided. In one embodiment, the method includes driving a film at a predetermined line speed, generating one or more continuous, periodic trigger signals based at least in part on the predetermined line speed, in which the one or more continuous, periodic trigger signals correspond with one or more marking areas of the film to be marked thereon, generating marking signals based on the one or more continuous, periodic trigger signals, and marking the film based on the marking signals at substantially the one or more marking areas of the film.

In yet another aspect, apparatuses for marking a moving film are provided. In one embodiment, the apparatus includes a triggering apparatus that repeatedly provides a trigger signal based at least in part on a predetermined line speed of a film, in which the trigger signal corresponds with one or more marking areas of the film to be marked thereon, and a controller, in communication with the triggering device, that is configured to receive the trigger signal and, upon receipt of the trigger signal, generates a marking signal.

In another aspect, methods for fabricating a metallized marked film are provided. In one embodiment, the method includes providing a film marked by a method as described above. The film includes a base substrate having a first surface and a second surface opposite the first surface, the first surface comprising the one or more marking areas, and at least one marking positioned substantially within the one or more marking areas. The method further includes disposing a metallized layer over the first surface of the base substrate, in which the at least one marking is located between the base substrate and the metallized layer.

In yet another aspect, methods for fabricating a package for containing a product therein are provided. In one embodiment, the method includes providing a metallized marked film formed by a method, as described above, and forming the metallized marked film into a flexible container having a front side and a back side sealed together along at least one longitudinal seam and two lateral end seams.

In another aspect, methods for packaging a product are provided. In one embodiment, the method includes providing a metallized marked film formed by a method, as described above, folding the metallized marked film into a tubular form, forming a longitudinal sealed seam by joining opposite longitudinal edges of the tubularly formed metallized marked film, forming a first traverse end sealed seam, introducing a product into the tubularly formed metallized marked film, and forming a second traverse end sealed seam to enclose the product therein.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale.

FIG. 3 is a perspective, partial front view of a reference device in accordance with an embodiment of the present disclosure.

FIGS. 4A-4D are side views of reference devices with different reference marks in accordance with the present disclosure.

DETAILED DESCRIPTION

Figure 1:
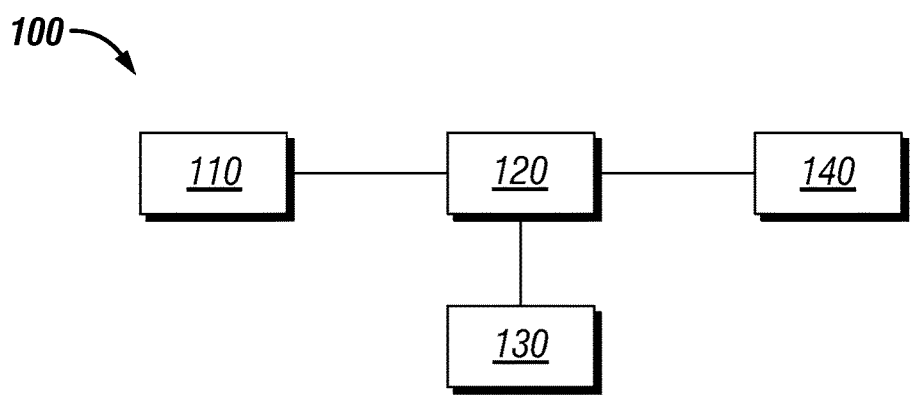
FIG. 1 is a block diagram illustrating a system for marking a moving film in accordance with an embodiment of present disclosure.

Improved systems and apparatuses have been developed for marking a moving film. The systems and apparatuses described herein employ an triggering apparatus that facilitates marking, in register, a moving film that does not have pre-printed eyespots/references marks positioned thereon. The triggering apparatus repeatedly provides a trigger signal that is based at least in part on a predetermined line speed of a film and corresponds with one or more marking areas of the moving film to be marked thereon. This trigger signal in turn prompts a marking device to then mark the film at the desired one or more marking areas of the moving film. That is, the triggering apparatus advantageously enables the marking of a moving film without traditional eyespots/reference marks pre-applied on the film. In other words, this triggering apparatus beneficially provides the ability to accurately mark a moving unprinted film, e.g., clear or colored polymer substrates, paper substrates, foil or metallized substrates, and the like, in repeat sequence at any given speed.

Several embodiments of the systems for marking a moving film, apparatuses for marking the moving film, and methods for marking the moving film are described herein. Parameters of different steps, components, and features of the embodiments are described separately, but may be combined consistently with this description of claims, to enable other embodiments as well to be understood by those skilled in the art. Various terms used herein are likewise defined in the description which follows.

Currently, the conventional processes for marking a moving film include the pre-application of eyespots/reference marks on the film such that as the film is introduced to the marking equipment, the eyespots/reference marks are detected, triggering the marking equipment, e.g., inkjet printing systems, laser etching systems, and the like, to incorporate the desired graphic(s), e.g., promotional codes, "born-on dates", tracking codes, expiration dates, other codes, etc., onto the moving film at registered locations. However, these processes typically result in an increase in production costs. Furthermore, these processes also do not account for variations in web tension, temperature variations, or other factors that affect the distance between the pre-applied eyespots/reference marks on the film, resulting in the misapplication of the desired graphics at incorrect locations on the film.

Systems for Marking a Moving Film

In accordance with the description, systems have been developed that mark a moving film, without eyespots/reference marks printed thereon, at the desired location or locations on the film. That is, the systems as described herein are capable of marking a moving film that does not undergo pre-printing processing, as is the case in conventional processes, thereby decreasing production cost and time. Furthermore, by eliminating the need for pre-printed eyespots/references mark on the film, these systems avoid mismarking the film due to potential physical and/or chemical variations of the film during processing, and therefore ensure that the film is marked in register with the graphics and at the desired location or locations as they relate to further downstream processing of the film (e.g., metallizing, printing, laminating, Form-Fill-Seal).

Furthermore, the markings of the marked film produced by the systems described herein are beneficially capable of being embedded underneath one or more overlayers, such as an aluminum metal layer deposited via the physical vapor deposition (PVD) process, when the marked film is converted into a package, while also being advantageously visible on the inside of the resulting package, which is not otherwise possible with conventional approaches. Also, since the markings of the marked film are embedded within the layers of the package, potential removal of the markings via scratching is prevented, unlike with conventionally marked films.

Moreover, given that the markings are reversed printed onto the film, followed by metallization, the markings become embedded and the potential for direct contamination of the product housed within the package by the material of the markings is minimized, if not eliminated. For example, when a marked film is subsequently metallized, the marking becomes buried within the overall film and thus, avoids contamination with the product subsequently disposed within the resulting package formed from such film.

In embodiments, the system generally includes a triggering apparatus that repeatedly provides a trigger signal based at least in part on the predetermined line speed, wherein the trigger signal corresponds with one or more marking areas of the film to be marked thereon, a controller, in communication with the triggering apparatus, that is configured to receive the trigger signal and, upon receipt of the trigger signal, generates a marking signal, and a marking device that receives the marking signal and, upon receipt of the marking signal, marks the film at substantially the one or more marking areas. In some embodiments, the triggering apparatus is not located in-line with the moving film. Rather, the triggering apparatus, in certain embodiments, is positioned off-line with respect to the moving film.

In some embodiments, the system also includes a driving device that moves the film at the predetermined line speed. In certain embodiments, the marking device is connected to the driving device.

In some embodiments, the driving device includes a slitter, a laminator, a printer, a unwinder/rewinder, coating equipment, and the like, or any device that allows for a roll of film to unwind in a control manner. In one embodiment, the driving device also includes an encoder that is placed on the driving device to reference, during operation, the line speed of the film, thereby providing accurate, real-time line speed information. That is, the use of an encoder advantageously enables the systems described herein to account for, and thus adapt to, line speed variations that may occur during operation, thereby minimizing the potential for mis-marking on the film as a result of untimely trigger signals.

A block schematic of an exemplary system is illustrated in FIG. 1. FIG. 1 shows a system 100 that includes a driving device 110, a triggering apparatus 140 and a marking device 130, all of which are in communication with a controller 120.

The film may be formed from a single or multi-layer film using one or more flexible film materials suitable for use in packaging. For example, in certain embodiments, the flexible film materials may include one or more layers of one or more paper-based materials, polymeric materials, metallized polymeric materials, metallic foils, or combinations thereof. Non-limiting examples of suitable polymeric materials include oriented polypropylene (OPP), polyethylene terephthalate (PET), nylon, polyethylene (PE), polypropylene (PP), polyactide (PLA), polymethyl methacrylate (PMMA), polystyrene (PS), and the like, and combinations thereof, it being understood that many other polymers and copolymers are also suitable. These materials may be produced as a cast or blown film and may be subsequently bi-axially or mono-axially oriented. Further functionality may be added by coating the materials by a vacuum deposition, aqueous deposition, spray process, or other means.

Figure 2:
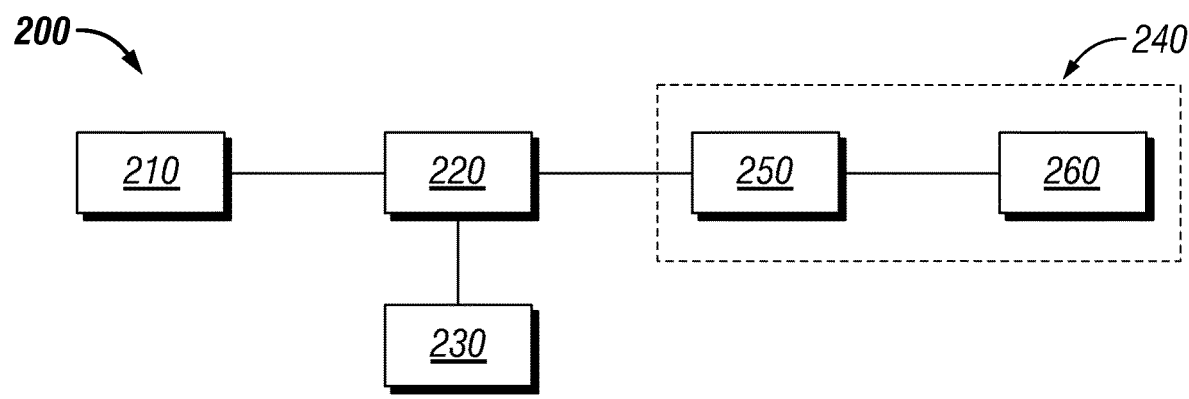
FIG. 2 is a block diagram illustrating a system for marking a moving film in accordance with another embodiment of present disclosure.

In some embodiments, the triggering apparatus includes any suitable mechanical or electrical device or devices capable of producing an electrical signal (e.g., a pulse generator, a counter, a metronome, photovoltaic systems, and the like). Examples of systems with different trigger apparatuses are illustrated in FIG. 1 and FIG. 2.

In one embodiment, the triggering apparatus, as shown for example in FIG. 1, is a pulse generator that is configured to repeatedly generate an electric pulse output based at least in part on a predetermined time interval, wherein the trigger signal is the electric pulse output. In embodiments, the pulse generator sends a square wave electronic signal pulse (either PnP or NpN), in certain embodiments, directly to a marking device, and in other embodiments, indirectly to a marking device via, e.g., a controller. In embodiments where the pulse generator directly sends the square wave electronic signal pulse, the trigger signal is therefore in effect the marking signal.

The pulse signal consists of a continuous sinusoidal waveform whereby each leading edge in the wave corresponds to the trigger signal that is subsequently sent to a marking device to mark the moving film. Since the line speed of the film is predetermined, the leading edge of each wave is set to a corresponding marking area on the film, in which the time between the leading edge signals therefore represents the specific repeat length for each mark. That is, the time between leading edge to leading edge of the one or more marking areas of the film is therefore the time required for one complete cycle, i.e. the predetermined time interval represented as frequency (Hz).

In some embodiments, the predetermined time interval (frequency) is synchronized with the predetermined line speed. As way of example, in one embodiment, the predetermined line speed of the film is 900 feet per minute (FPM) and the repeated distance between each sequential marking area on the film is 6.0 inches, therefore the total number of markings required within one complete cycle is 1800 per minute, which is effectively 30 markings per second (i.e., one marking applied every 0.033 seconds). Thus, the predetermined time interval (T), represented as frequency, is 30 Hz.

In embodiments where the line speed is constant, such as in the foregoing example, T can be adjusted up or down to change the effective distance between the markings areas of the moving film at any given line speed selected. That is, if the line speed of the film is constant, T can be adjusted to manipulate the distance between each sequential marking area.

In embodiments where the line speed is not constant, T can be synchronized with the variable line speed. In one embodiment, a computer program may be used to adjust the frequency in real time based on variations in the line speed during the marking process.

In other embodiments, the triggering apparatus includes a reference device and a sensor, for example, as illustrated in FIG. 2. FIG. 2 shows a block schematic of a system 200 that includes a driving device 210, a triggering apparatus 240 that includes a sensor 250 and a reference device 260, and a marking device 230, all of which are all in communication with a controller 220.

The reference device repeatedly presents one or more reference marks that correspond with the one or more marking areas of the film to be marked thereon. The one or more reference marks may comprise any suitable material that can be detected by the sensor. Non-limiting examples include dye (visible or non-visible), ink (visible or non-visible), paint, tape, and the like, and combinations thereof.

The sensor is configured to repeatedly detect the one or more reference marks of the reference device and, upon detection, generates the trigger signal. Any suitable sensor may be utilized. Non-limiting examples include optical systems, such as a photosensor, a fiber optic sensor, and the like.

In some embodiments, the reference device is designed according to the distance, in the machine direction, between the one or more marking areas of the film to control the frequency of markings over a given distance. As such, for each package size, a different sized reference device may be needed.

As used herein, "machine direction" means the direction the film travels/moves through the driving device during operation.

In some embodiments, the frequency output from an AC drive is recorded for the reference device to establish a "setting" for the corresponding predetermined package size. Once a "setting" is established, the surface speed of the reference device is subsequently verified using a calibrated tachometer (e.g., a tachometer with an accredited calibration in accordance with ISO/IEC: 17025, with a total uncertainty ratio of 10 to 1 over the process requirement). In one embodiment, the surface speed of the reference device falls in a frequency range of 16 to 24 Hz.

In one embodiment, the AC drive may be pre-programmed with preset frequencies/speeds, via an electrical box, chosen by an operator to match different sized reference devices at any given time.

In embodiments, the one or more reference marks are positioned on a surface of the reference device. In one embodiment, the one or more reference marks are positioned at equidistance, based at least in part on a predetermined package size, on the surface of the reference device. In another embodiment, the positioning of the one or more reference marks is also based on the predetermined distance between sequential marking areas of the film. In yet another embodiment, the reference device has a substantially circular outer circumferential surface, wherein the one or more reference marks are positioned at equidistance thereon.

FIG. 3 illustrates an exemplary reference device 300 having three reference marks 302 on the surface 304 thereof, with a distance, d, between each reference mark 302. FIGS. 4A-4D depicts various reference devices, 400A, 400B, 400C, 400D, each with different sized reference marks 402A, 402B, 402C, 402D, respectively, positioned on the surface 404A, 404B, 404C, 404D thereof.

In some embodiments, the reference device has a surface speed that is substantially synchronized with the predetermined line speed of the film. As used herein, "surface speed" is the tangential speed of the reference device. For example, the surface speed of the reference device 300 illustrated in FIG. 3 is the linear speed of the circumferential surface 304 as the reference device 300 rotates.

Once the surface speed of the reference device is determined, the surface speed of the reference device can then be substantially matched to the known line speed of the film. As a result, the distance between the one or more reference marks will engage the system to mark the moving film at the given distance along the reference device, thereby controlling repeat and registered marking on the moving film. In one embodiment, a reference device with a circumference of 19.5 inches and a diameter of 6.21 inches and having three equidistant reference marks positioned thereon at 6.5 inches apart is used to mark a moving film that has a distance of 6.5 inches between the one or more marking areas, such that the film is marked in register with the one or more marking areas.

In some embodiments, the trigger apparatus further comprises a motor, connected to a power source, configured to control the speed of the reference device, and operable at a speed that is substantially synchronized with the predetermined line speed of the film. As such, the ability to adjust the speed of the motor therefore enables adjustment of the surface speed of the reference device, during operation, to account for variations, if any, that can occur between the line speed and the predetermined line speed. That is, the synchronization between the speed of the reference device and the line speed is capable of being maintained substantially, if not entirely, throughout the operational period of the system. In one embodiment, the power source produces a drive output that controls the speed of the motor. For example, the power source may be an AC drive that delivers power to the motor. Since motor speed is dependent upon frequency, varying the frequency output of the AC drive therefore controls the motor speed and in turn, the speed of the reference device.

In embodiments where the power source includes an AC drive, the power source, in some embodiments, also includes a potentiometer that is configured to adjust the frequency output of the AC drive, and therefore the speed of the motor. In another embodiment, software or firmware may be utilized to adjust the frequency output of the AC drive.

Figure 5:
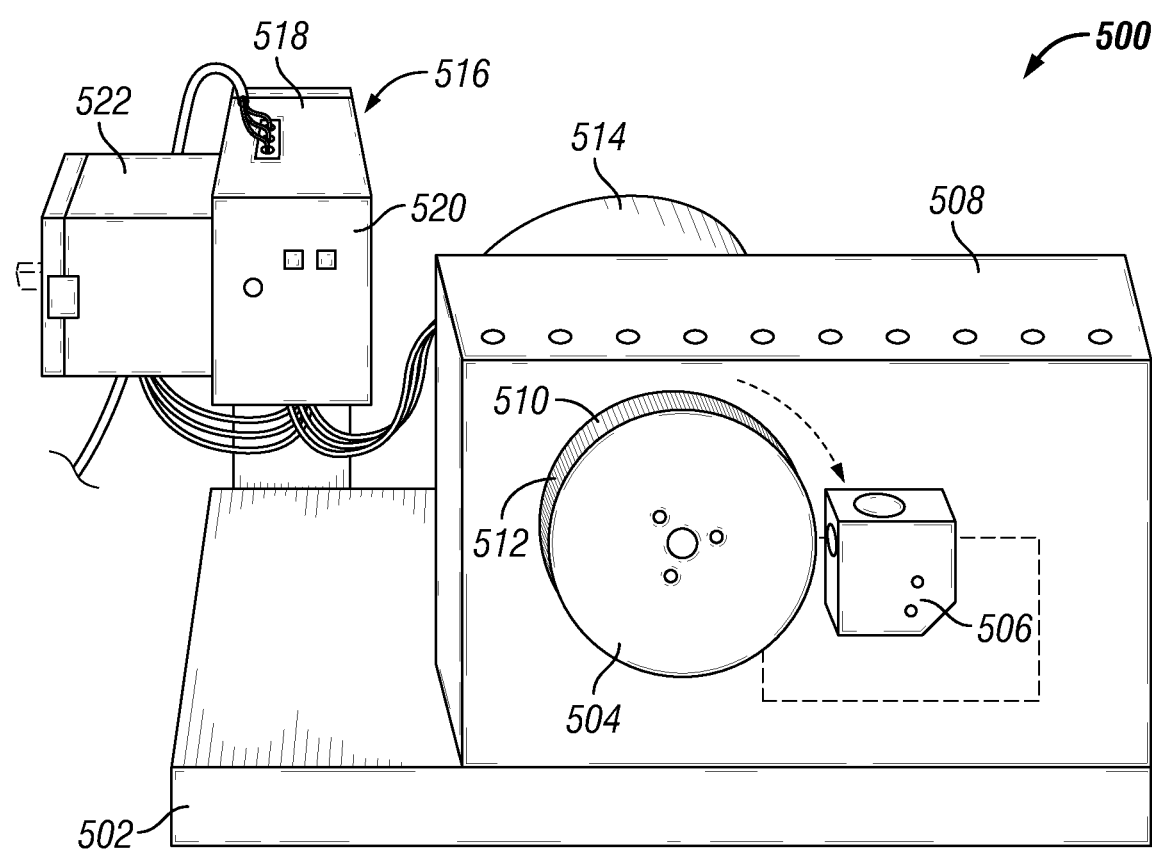
FIG. 5 is a perspective, partial front view of an apparatus for marking a moving film in accordance with another embodiment of the present disclosure.
Figure 6:
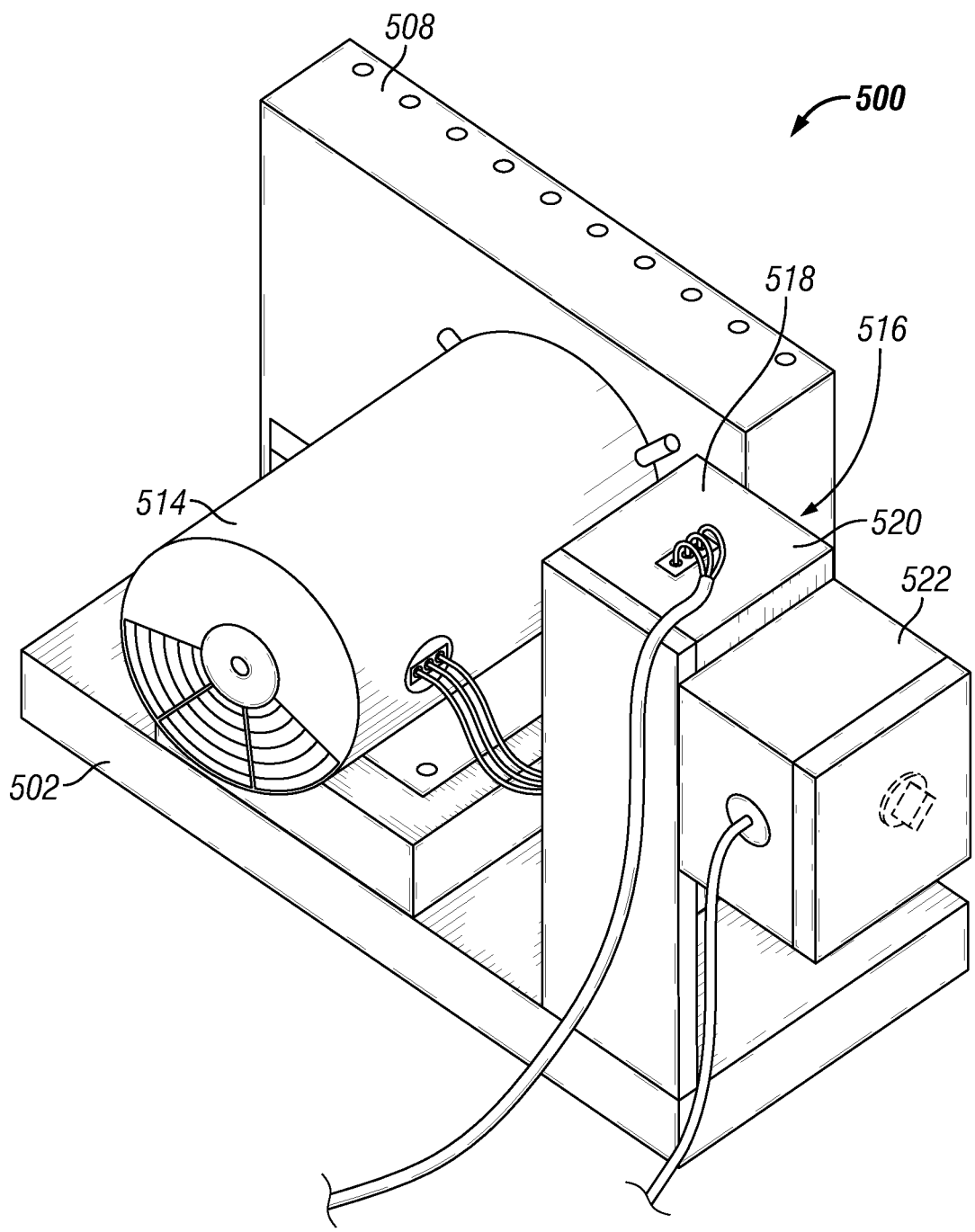
FIG. 6 is a perspective, partial back view of the apparatus in FIG. 5.

An exemplary embodiment of a triggering apparatus for marking, in register, a moving film without pre-applied eyespots/reference marks thereon is illustrated in FIGS. 5 and 6. The triggering apparatus 500 is mounted to a base 502. The triggering apparatus 500 includes a reference device 504 and a sensor 506 that are affixed to a housing 508. The reference device 504 includes one or more reference marks 510 that are positioned at equidistance on a surface 512 of the reference device 504. The reference device 504 is attached to a motor 514, connected to a power source 516, that controls the speed of the reference device 504. The power source 516 includes an AC drive 518 and a potentiometer 520. The AC drive 518 is preprogramed with pre-sets via an electrical box 522 that is attached thereto. The sensor 506 is positioned proximal to the reference device 502 in order to repeatedly detect the one or more reference marks 510. As the sensor 506 detects each of the one or more reference marks 510, the sensor 506 subsequently generates the corresponding trigger signal.

In embodiments, the system also includes a controller that is in communication with the triggering apparatus. In one embodiment, the controller communicates with the triggering apparatus via hardwire. In another embodiment, the controller wirelessly communicates with the triggering apparatus. In either instance, the controller is configured to receive the trigger signal provided by the triggering apparatus, and upon receipt of the trigger signal, generates a marking signal. This marking signal is utilized to engage the system to mark the moving film at the desired locations.

In one embodiment, the controller includes one or more processors. The one or more processors may be implemented as appropriate in hardware, software, firmware, or combinations thereof. Software or firmware implementations of the one or more processors may include computer-executable or machine-executable instructions written in any suitable programming language to perform the various functions described. Hardware implementations of the one or more processors may be configured to execute computer-executable or machine-executable instructions to perform the various functions described (e.g., to receive the trigger signal, to generate the marking signal, etc.). The one or more processors may include, without limitation, a central processing unit (CPU), a digital signal processor (DSP), a reduced instruction set computer (RISC), a complex instruction set computer (CISC), a microprocessor, a microcontroller, a field programmable gate array (FPGA), or any combination thereof. In certain embodiments, the controller may also include a chipset for controlling communications between one or more processors and one or more of the other components of the controller. The one or more processors may also include one or more application specific integrated circuits (ASICs) or application specific standard products (ASSPs) for handling specific data processing functions or tasks. In certain embodiments, the controller may be based on an Intel® Architecture system and the one or more processors and chipset may be from a family of Intel® processors and chipsets, such as the Intel® Atom® processor family.

In embodiments, the system also includes a marking device that is configured to receive the marking signal generated by the controller, and upon receipt of the marking signal, marks the film at substantially the one or more marking areas. In certain embodiments, the marking device is connected to the driving device. Non-limiting examples of suitable types of marking devices includes an ink jet printing system, a pad printing system, a flexo printing system, a gravure printing system, a laser etching system, and the like.

In embodiments where the marking device is an ink jet printing system, the marking device, in certain embodiments, comprises one or more ink jet heads mounted on the driving device, perpendicular to the machine direction. The one or more ink jet heads may be positioned apart at any desired distance. For example, five ink jet heads may be mounted, perpendicular to the machine direction, equal distance apart. Proper positioning of the one or more ink jet heads on the driving device helps to align the markings, when printed, with the downstream processes such as metallizing, printing, and lamination, used to form the resulting marked film. The resulting marked film may be formed in off-line or on-line processes with respect to packaging of a product. The one or more ink jet heads may be mounted to the driving device, e.g., via mounting brackets, to also facilitate movement of the ink jet heads either closer or farther away from the moving film as needed. In one embodiment, the distance between the ink jet heads and the moving film is about 0.01 inches or greater. In another embodiment, the distance between the ink jet heads and the moving film is from about 0.25 inches to about 0.50 inches. The distance between the ink jet heads and the moving film accounts for fluctuations in the moving film at high speeds, thereby enabling the ink jet print heads to print at suitably legible quality throughout the marking process.

In embodiments, the marking device marks the film at substantially the one or more marking areas with one or more graphics. Non-limiting examples of graphics include one or more words, one or more numbers, one or more letters, one or more shapes, one or more symbols, one or more patterns, one or more scores, and combinations thereof.

Methods for Marking a Moving Film

In operation, the systems described herein mark, in register, a moving film without pre-applied eyespots/reference marks thereon, such as the moving films described herein. In one embodiment, a method for marking a moving film includes driving a film at a predetermined line speed, generating one or more continuous, periodic trigger signals based at least in part on the predetermined line speed, wherein the one or more continuous, periodic trigger signals correspond with one or more marking areas of the film to be marked thereon, generating marking signals based on the one or more continuous, periodic trigger signals, and marking the film based on the marking signals at substantially the one or more marking areas of the film.

In some embodiments, the step of generating the one or more continuous, periodic trigger signals comprises repeatedly generating one or more electric pulse outputs based at least in part on a predetermined time interval.

In other embodiments, the step of generating the one or more continuous, periodic trigger signals comprises, presenting recurring one or more reference marks that substantially correspond with the one or more marking areas of the film to be marked thereon, and detecting the recurring one or more references marks, and providing the one or more continuous, periodic trigger signals. In one embodiment, the one or more reference marks are positioned at equidistance, based at least in part on a predetermined package size, on a surface of the reference device.

In some embodiments, the step of marking the film comprises ink jet printing at substantially the one or more marking areas of the film one or more words, one or more numbers, one or more letters, one or more shapes, one or more symbols, one or more patterns, or combinations thereof.

In some embodiments, the step of marking the film comprises laser etching at substantially the one or more marking areas of the film one or more words, one or more numbers, one or more letters, one or more shapes, one or more symbols, one or more patterns, one or more scores, or combinations thereof.

Figure 7:
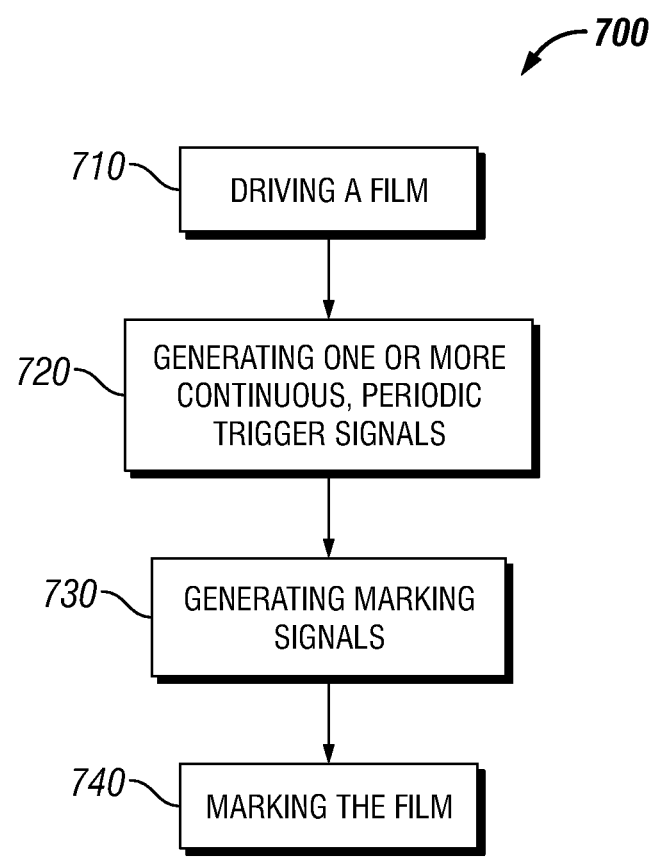
FIG. 7 is a block diagram illustrating an embodiment of a method for marking a moving film in accordance with the present disclosure.

An exemplary embodiment of a method for marking a film is illustrated in FIG. 7. The method 700 includes driving a film 710, generating one or more continuous, periodic trigger signals 720, generating marking signals 730, in response to each generated one or more continuous, periodic trigger signals, and marking the film 740. The step of generating one or more continuous, period trigger signals 720 includes presenting the recurring one or more reference marks, detecting the recurring one or more reference marks, and providing the one or more continuous, periodic trigger signals.

Metallized Marked Films and Methods of Manufacture

The moving films that are marked by the methods described herein may be used to form metallized marked films that include at least one marking that is embedded within the film. Embedding markings within the film advantageously minimizes, if not eliminates, the potential for the material of the markings to come into contact with the product housed within a package formed of the film. The less the markings come in contact with the product, the less the possibility for direct contamination of the product by the material of the marking.

Figure 8:
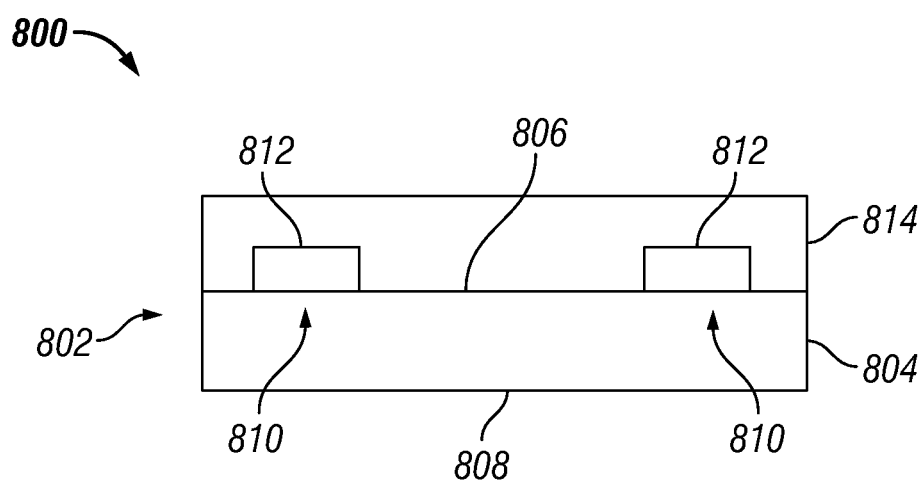
FIG. 8 is a cross-sectional view of a metallized marked film in accordance with an embodiment of the present disclosure.

One embodiment of a metallized marked film is shown in FIG. 8. The metallized marked film 800 includes a marked film 802. The marked film 802 includes a base substrate 804 having a first surface 806 and a second surface 808 opposite the first surface 806, the first surface 806 comprising one or more marking areas 810.

The base substrate may be formed from a single or multi-layer film using one or more flexible substrate materials suitable for use in packaging. For example, in certain embodiments, the flexible substrates materials may include one or more layers of one or more paper-based materials, polymeric materials, or combinations thereof. Non-limiting examples include single layer or multi-layer films of suitable polymers, including but not limited to polyolefins, such as polyethylene terephthalate (PET), polypropylene (PP), polyamide (PA), and coated paper, it being understood that many other polymers, copolymers, and combinations thereof are also suitable. These materials may be produced as a cast or blown film and may be subsequently bi-axially or mono-axially oriented.

The marked film 802 also includes at least one marking 812 in which the at least one marking 812 is substantially positioned within the one or more marking areas 810. In embodiments, the one or more marking areas 810 may each comprise the same marking or markings, different marking or markings, or a combination thereof.

In some embodiments, the at least one marking 812 is in the form of one or more words, one or more numbers, one or more letters, one or more shapes, one or more symbols, one or more patterns, one or more scores, or combinations thereof. In one embodiment, the at least one marking 812 is visible through the second surface 808 of the base substrate 802 of the metalized marked film 800. As used herein, the term visible is defined as being discernible or recognizable to a human eye.

The metallized marked film 800 also includes a metallized layer 814. The metallized layer 814 is disposed over the first surface 806 of the base substrate 804, such that the at least one marking 812 is located between the base substrate 804 and the metallized layer 814. As a result, the base substrate 804 is the innermost layer and the metallized layer 814 is the outermost layer of the metallized marked film 800. This structural configuration is one configuration that embeds the at least one marking 812 within the metallized marked film 800. In one embodiment, the metallized layer 814 comprises aluminum.

The method for fabricating a metallized marked films provided herein may include providing a film marked by the methods described herein, and disposing a metallized layer over the first surface of the base substrate of the film. Thus, the at least one marking of the film is located between the base substrate of the film and the metallized layer. In some embodiments, the step of disposing the metallized layer includes physical vapor depositing the metallized layer of the first surface of the base substrate. In one embodiment, the metallized layer includes aluminum.

Once formed, the metallized marked film is either directly fed or first stored as a roll and later fed into a packaging process, such as Form-Film-Seal process.

Packages and Methods of Manufacture

The metallized marked films described herein may be used to form a package for containing a product therein. In certain embodiments, a roll of flexible film comprising a metallized marked film described herein may be used to form a package.

Figure 9A:
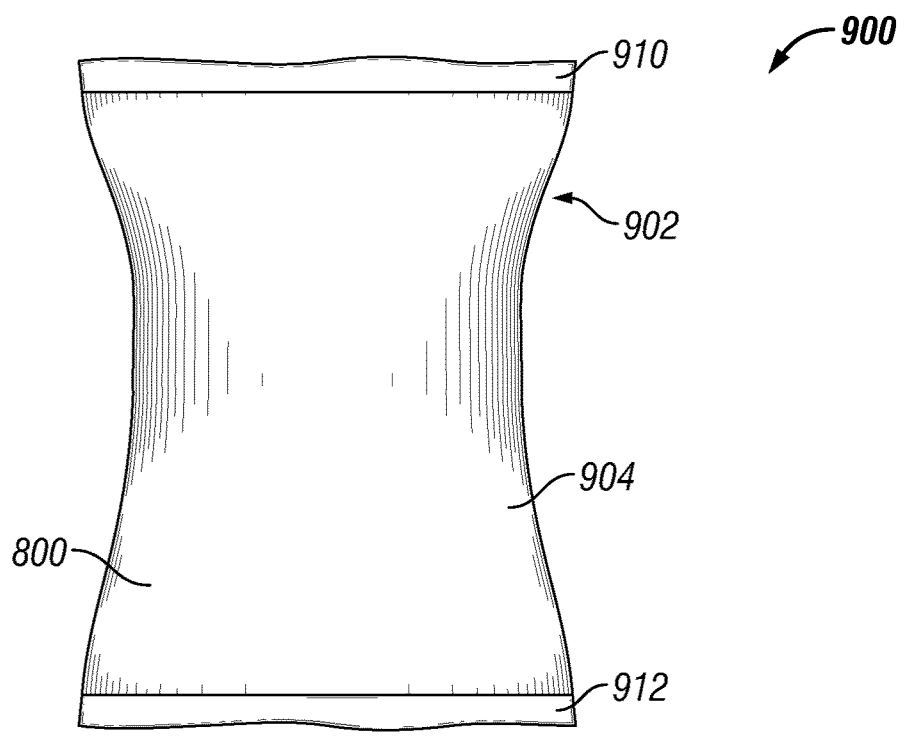
FIG. 9A is a front view of a package formed from the metallized marked film shown in FIG. 8 in accordance with an embodiment of the present disclosure.
Figure 9B:
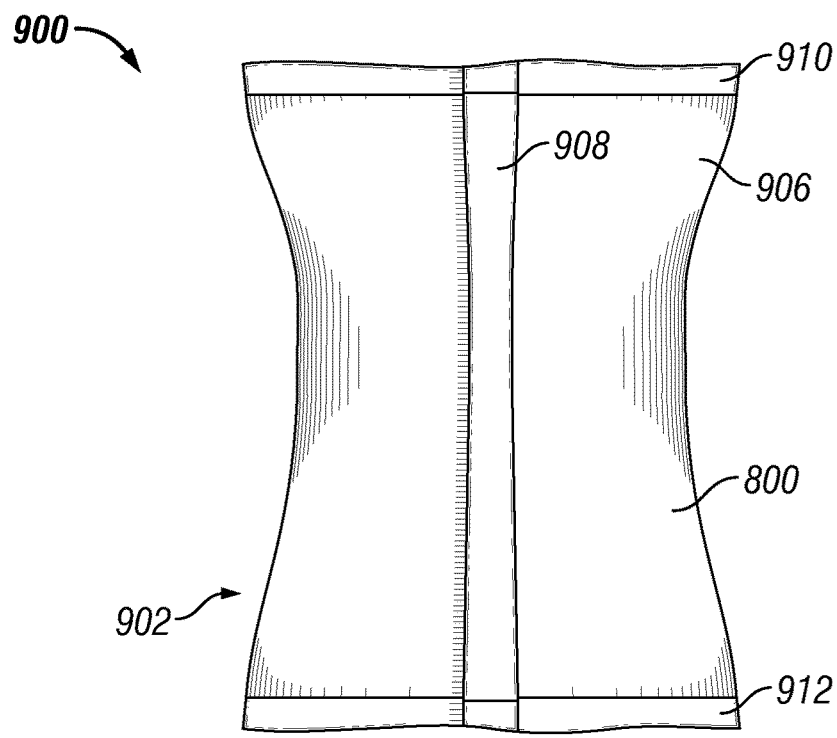
FIG. 9B is a back view of the package shown in FIG. 9A.

As shown in FIGS. 9A and 9B, in one embodiment, a package 900, includes a flexible container 902 formed from the metallized marked film 800 of FIG. 8, in which the flexible container 902 has a front side 904 and a back side 906. The front side 904 and the back side 906 are sealed together along at least one longitudinal seam 908 and two lateral end seams 910, 912.

The packages as described herein may be formed from the metallized marked film, for example, by a horizontal or vertical FFS process using heat sealing, cold sealing, ultrasonic sealing, radio frequency welding, induction welding or combinations thereof to form the at least one longitudinal seam and the two lateral end seams. In some embodiments, the metallized marked film may be constructed of layers of up to about 700 gauge thickness.

In one embodiment, the method for fabricating a package for containing a product may include providing a metallized marked film, as described above, and forming the metallized marked film into a flexible container having a front side and a back side sealed together along at least one longitudinal seam and two lateral end seams. For example, the metallized marked film may be fed from a roll and then folded to the desired package shape and stabilized by heat sealing the longitudinal seam and the first of the two lateral end seams. The product may then be placed into the formed package, and the remaining opening, i.e. the second of the two lateral end seams, is sealed. Machines can be configured so that the printed multilayer polymeric film travels horizontally through the machine (horizontal FFS) or vertically through the machine (vertical FFS) for food and non-food production.

Accordingly to some embodiments, the package herein may be used for containing a variety of pourable dry-food products, particularly food products. Non-limiting examples of such products include cereal, chips, crackers, cookies, baked goods, snack foods, and the like.

The packaging of a product in a package formed from metallized marked films described herein can be achieved using any suitable packaging method, e.g., FFS. In certain embodiments, the method for packaging a product may include providing a metallized marked film as described herein, folding the metallized marked film into a tubular form, forming a longitudinal sealed seam by joining opposite longitudinal edges of the tubularly formed metallized marked film, forming a first traverse end sealed seam, introducing a product into the tubularly formed metallized marked film, and forming a second traverse end sealed seam to enclose the product therein.

In embodiments, providing a metallized marked film may include forming the metallized marked film in off-line or in-line processes with respect to packaging of the product, and also may be formed in both horizontal and vertical FFS operations, among others. For example, the metallized marked film may be formed in-line just before the film is formed into a package body, filled with product, and sealed. Alternatively, the metallized marked film may be formed, then wound on a reel, e.g., by a packaging converter, and then loaded into the packaging equipment on which it is then unwound and formed into a package body, filled with product, and sealed.

For the purposes of describing and defining the present teachings, it is noted that the terms "substantially" and "about" are utilized herein to represent the inherent degree of uncertainty that may be attributed to any quantitative comparison, value, measurement, or other representation. The terms "substantially" and "about" are also utilized herein to represent the degree by which a quantitative representation may vary from a stated reference without resulting in a change in the basic function of the subject matter at issue.

The following numbered aspects, embodiments, and features of the disclosure are provided, with an emphasis on the ability to combine the various features which may disclosed only in certain embodiments, into other disclosed embodiments, as the context and technical reason allow.

Clause 1. A system for marking a moving film without pre-applied eyespots or reference marks thereon that moves at a predetermined line speed, said system comprising:
 a triggering apparatus that repeatedly provides a trigger signal based at least in part on the predetermined line speed, wherein the trigger signal corresponds with one or more marking areas of the film to be marked thereon;
 a controller, in communication with the triggering device, that is configured to receive the trigger signal and, upon receipt of the trigger signal, generates a marking signal; and
 a marking device that receives the marking signal and, upon receipt of the marking signal, marks the film at substantially the one or more marking areas.

Clause 2. The system for marking a moving film of clause 1, further comprising a driving device that moves the film at the predetermined line speed, wherein the marking device is connected to the driving device.

Clause 3. The system for marking a moving film of clause 1, wherein the triggering apparatus comprises a pulse generator that is configured to repeatedly generate an electric pulse output based at least in part on a predetermined time interval, and wherein the trigger signal is the electric pulse output.

Clause 4. The system for marking a moving film of clause 3, wherein the predetermined time interval is synchronized with the predetermined line speed of the film.

Clause 5. The system for marking a moving film of claim 1, wherein the triggering apparatus comprises,
 a reference device that repeatedly presents one or more reference marks that correspond with the one or more marking areas of the film to be marked thereon, and
 a sensor that is configured to repeatedly detect the one or more reference marks of the reference device and, upon detection, generates the trigger signal.

Clause 6. The system for marking a moving film of clause 5, wherein the one or more reference marks are positioned at about equidistance, based at least in part on a predetermined package size, on a surface of the reference device.

Clause 7. The system for marking a moving film as in clause 5 or 6, wherein the reference device has a surface speed that is substantially synchronized with the predetermined line speed of the film.

Clause 8. The system for marking a moving film of any one of clauses 5 to 7, wherein the reference device has a substantially circular outer circumferential surface, and wherein the one or more reference marks are positioned at about equidistance thereon.

Clause 9. The system for marking a moving film of any one of clauses 5 to 8, wherein the trigger apparatus further comprises a motor, connected to a power source, configured to control the speed of the reference device, and operable at a speed that is substantially synchronized with the predetermined line speed of the film.

Clause 10. The system for marking a moving film of clause 9, wherein the power source produces a drive output that controls the speed of the motor.

Clause 11. The system for marking a moving film of any one of clauses 1 to 10, wherein the marking device is an ink jet printing system or a laser etching system.

Clause 12. The system for marking a moving film of any one of clauses 1 to 11, wherein the marking device marks the film at substantially the one or more marking areas with one or more words, one or more numbers, one or more letters, one or more shapes, one or more symbols, one or more patterns, one or more scores, or combinations thereof.

Clause 13. A method for marking a moving film without pre-applied eyespots or reference marks thereon, said method comprising:
   driving a film at a predetermined line speed;
   generating one or more continuous, periodic trigger signals based at least in part on the predetermined line speed, wherein the one or more continuous, periodic trigger signals correspond with one or more marking areas of the film to be marked thereon;
   generating marking signals based on the one or more continuous, periodic trigger signals; and
   marking the film based on the marking signals at substantially the one or more marking areas of the film.

Clause 14. The method for marking a moving film of clause 13, wherein the step of generating the one or more continuous, periodic trigger signals comprises repeatedly generating one or more electric pulse outputs based at least in part on a predetermined time interval.

Clause 15. The method for making a moving film of clause 14, wherein the predetermined time interval is substantially synchronized with the predetermined line speed.

Clause 16. The method for marking a moving film of clause 13, wherein the step of generating the one or more continuous, periodic trigger signals comprises,
   presenting recurring one or more reference marks that substantially correspond with the one or more marking areas of the film to be marked thereon;
   detecting the recurring one or more references marks; and
   providing the one or more continuous, periodic trigger signals.

Clause 17. The method for marking a moving film of clause 16, wherein each of the recurring one or more reference marks are positioned substantially equidistant, based at least in part on a predetermined package size, from one another.

Clause 18. The method for marking a moving film of clause 16, wherein the recurring one or more reference marks are positioned at about equidistance, based at least in part on a predetermined package size, on a surface of a reference device.

Clause 19. The method for marking a moving film of clause 18, wherein the reference device has a surface speed that is substantially synchronized with the predetermined line speed of the film.

Clause 20. The method for marking a moving film of any one of clauses 13 to 19, wherein the step of marking the film comprises ink jet printing at substantially the one or more marking areas of the film one or more words, one or more numbers, one or more letters, one or more shapes, one or more symbols, one or more patterns, or combinations thereof.

Clause 21. The method for marking a moving film of any one of clauses 13 to 19, wherein the step of marking the film comprises laser etching at substantially the one or more marking areas of the film one or more words, one or more numbers, one or more letters, one or more shapes, one or more symbols, one or more patterns, one or more scores, or combinations thereof.

Clause 22. An apparatus for marking a moving film without pre-applied eyespots or reference marks thereon, said apparatus comprising:
   a triggering apparatus that repeatedly provides a trigger signal based at least in part on a predetermined line speed of a film, wherein the trigger signal corresponds with one or more marking areas of the film to be marked thereon; and
   a controller, in communication with the triggering device, that is configured to receive the trigger signal and, upon receipt of the trigger signal, generates a marking signal.

Clause 23. The apparatus for marking a moving film of clause 22, wherein the triggering apparatus comprises a pulse generator that is configured to repeatedly generate an electric pulse output based at least in part on a predetermined time interval, and wherein the trigger signal is the electric pulse output.

Clause 24. The apparatus for marking a moving film of clause 22, wherein the triggering apparatus comprises,
   a reference device that repeatedly presents one or more reference marks that correspond with the one or more marking areas of the film to be marked thereon, and
   a sensor that is configured to repeatedly detect the one or more reference marks of the reference device and, upon detection, generates the trigger signal.

Clause 25. The apparatus for marking a moving film of clause 24, wherein the one or more reference marks positioned at about equidistance, based at least in part on a predetermined package size, on a surface of the reference device.

Clause 26. The apparatus for marking a moving film as in clause 24 or 25, wherein the reference device performs at a speed that is substantially synchronized with the predetermined line speed of the film.

Clause 27. The apparatus for marking a moving film of any one of clauses 24 to 26, wherein the reference device has a substantially circular outer circumferential surface, and wherein the one or more reference marks are positioned at about equidistance thereon.

Clause 28. The apparatus for marking a moving film of any one of clauses 24 to 27, wherein the trigger apparatus further comprises a motor, connected to a power source, configured to control the speed of the reference device, and operable at a speed that is substantially synchronized with the predetermined line speed of the film.

Clause 29. The apparatus for marking a moving film of clause 28, wherein the power source produces a drive output that controls the speed of the motor.

Clause 30. A method for fabricating a metallized marked film, said method comprising:
providing the film marked by the method of clause 13, the film comprising,
a base substrate having a first surface and a second surface opposite the first surface, the first surface comprising the one or more marking areas, and
at least one marking positioned substantially within the one or more marking areas; and
disposing a metallized layer over the first surface of the base substrate, wherein the at least one marking is located between the base substrate and the metallized layer.

Clause 31. The method for fabricating a metallized marked film of clause 30, wherein the step of disposing the metallized layer comprises physical vapor depositing the metallized layer over the first surface of the base substrate.

Clause 32. The method for fabricating a metallized marked film of clause 30, wherein the metallized layer comprises aluminum.

Clause 33. The method for fabricating a metallized marked film of clause 30, wherein the step of generating the one or more continuous, periodic trigger signals comprises repeatedly generating one or more electric pulse outputs based at least in part on a predetermined time interval.

Clause 34. The method for fabricating a metallized marked film of clause 30, wherein the step of generating the one or more continuous, periodic trigger signals comprises,
presenting recurring one or more reference marks that substantially correspond with the one or more marking areas of the film;
detecting the recurring one or more references marks; and
providing the one or more continuous, periodic trigger signals.

Clause 35. The method for fabricating a metallized marked film of any one of clauses 30 to 34, wherein the step of marking the film comprises ink jet printing the at least one marking substantially within the one or more marking areas, and wherein the at least one marking is in the form of one or more words, one or more numbers, one or more letters, one or more shapes, one or more symbols, one or more patterns, or combinations thereof.

Clause 36. The method for fabricating a metallized marked film of any one of clauses 30 to 34, wherein the step of marking the film comprises laser etching the at least one marking substantially within the one or more marking areas, and wherein the at least one marking is in the form of one or more words, one or more numbers, one or more letters, one or more shapes, one or more symbols, one or more patterns, one or more scores, or combinations thereof.

Clause 37. A method for fabricating a package for containing a product therein, said method comprising:
providing the metallized marked film formed by the method of clause 30; and
forming the metallized marked film into a flexible container having a front side and a back side sealed together along at least one longitudinal seam and two lateral end seams.

Clause 38. The method for fabricating a package for containing a product therein of clause 37, wherein the metallized layer comprises aluminum.

Clause 39. A method for packaging a product, said method comprising:
providing the metallized marked film formed by the method of clause 30;
folding the metallized marked film into a tubular form;
forming a longitudinal sealed seam by joining opposite longitudinal edges of the tubularly formed metallized marked film;
forming a first traverse end sealed seam;
introducing a product into the tubularly formed metallized marked film; and
forming a second traverse end sealed seam to enclose the product therein.

It will be appreciated that various above-disclosed and other features and functions, or alternatives thereof, may be desirably combined into many other different products or applications. Various presently unforeseen or unanticipated alternatives, modifications, variations, or improvements therein may be subsequently made by those skilled in the art which are also intended to be encompassed by the following claims.

We claim:

1. A system for marking a moving film without pre-applied eyespots or reference marks thereon that moves at a predetermined line speed, said system comprising:
a triggering apparatus that repeatedly provides one or more periodic trigger signals based at least in part on the predetermined line speed, wherein the trigger signals correspond with one or more marking areas of the moving film to be marked thereon, wherein the triggering apparatus comprises:
a reference device that presents recurring one or more reference marks that correspond with the one or more marking areas of the moving film to be marked thereon, and
a sensor that is configured to repeatedly detect the one or more reference marks of the reference device and, upon detection, generates the trigger signal;
a controller, in communication with the triggering apparatus, that is configured to receive the trigger signal and, upon receipt of the one or more trigger signals, generates a marking signal; and
a marking device that receives the marking signal and, upon receipt of the marking signal, marks the moving film at substantially the one or more marking areas,
wherein the triggering apparatus comprises a pulse generator that is configured to repeatedly generate an electric pulse output based at least in part on a predetermined time interval, and wherein the trigger signal is the electric pulse output.

2. The system for marking a moving film of claim 1, wherein the reference device has a surface speed that is substantially synchronized with the predetermined line speed of the film.

3. The system for marking a moving film of claim 1, wherein the trigger apparatus further comprises a motor, connected to a power source, configured to control the speed of the reference device, and operable at a speed that is substantially synchronized with the predetermined line speed of the film.

4. The system for marking a moving film of claim 3, wherein the power source produces a drive output that controls the speed of the motor.

5. The system of claim 1, wherein the frequency of the periodic trigger signals can be adjusted independent of the predetermined line speed.

6. An apparatus for marking a moving film without pre-applied eyespots or reference marks thereon, said apparatus comprising:
- a triggering apparatus that repeatedly provides a trigger signal based at least in part on a predetermined line speed of a film, wherein the trigger signal corresponds with one or more marking areas of the film to be marked thereon, and wherein the triggering apparatus comprises:
  - a reference device that repeatedly presents one or more reference marks that correspond with the one or more marking areas of the film to be marked thereon, and
  - a sensor that is configured to repeatedly detect the one or more reference marks of the reference device and, upon detection, generates the trigger signal; and
- a controller, in communication with the triggering apparatus, that is configured to receive the trigger signal and, upon receipt of the trigger signal, generates a marking signal, wherein the triggering apparatus comprises a pulse generator that is configured to repeatedly generate an electric pulse output based at least in part on a predetermined time interval, and wherein the trigger signal is the electric pulse output.

7. The apparatus for marking a moving film of claim 6, wherein the reference device has a substantially circular outer circumferential surface, and wherein the one or more reference marks are positioned at about equidistance thereon.

8. The apparatus for marking a moving film of claim 6, wherein the trigger apparatus further comprises a motor, connected to a power source, configured to control the speed of the reference device, and operable at a speed that is substantially synchronized with the predetermined line speed of the film.

9. The apparatus of claim 6, wherein the frequency of the periodic trigger signals can be adjusted independent of the predetermined line speed.

* * * * *